(12) United States Patent
Delfino et al.

(10) Patent No.: US 10,488,189 B2
(45) Date of Patent: Nov. 26, 2019

(54) COMPUTATION OF A MEASUREMENT ON A SET OF GEOMETRIC ELEMENTS OF A MODELED OBJECT

(71) Applicant: Dassault Systemes, Vélizy-Villacoublay (FR)

(72) Inventors: Christophe Delfino, Laurent du Var (FR); Amal Plaudet-Hammani, Vélizy-Villacoublay (FR)

(73) Assignee: Dassault Systemes, Velizy-Villacoublay (FR)

( * ) Notice: Subject to any disclaimer, the term of this patent is extended or adjusted under 35 U.S.C. 154(b) by 414 days.

(21) Appl. No.: 15/212,806

(22) Filed: Jul. 18, 2016

(65) Prior Publication Data

US 2017/0016719 A1    Jan. 19, 2017

(30) Foreign Application Priority Data

Jul. 17, 2015   (EP) ..................................... 15306175

(51) Int. Cl.
*G06F 17/50*     (2006.01)
*G01B 21/00*     (2006.01)
*G06T 19/20*     (2011.01)
*G06F 3/0481*    (2013.01)
(Continued)

(52) U.S. Cl.
CPC ........... *G01B 21/00* (2013.01); *G06F 3/0488* (2013.01); *G06F 3/04817* (2013.01); *G06F 3/04842* (2013.01); *G06F 17/50* (2013.01); *G06T 19/20* (2013.01); *G06F 2203/04802* (2013.01); *G06F 2203/04808* (2013.01); *G06T 2219/004* (2013.01)

(58) Field of Classification Search
None
See application file for complete search history.

(56) References Cited

U.S. PATENT DOCUMENTS

| 8,902,219 | B1 | 12/2014 | Hauswirth et al. | |
|---|---|---|---|---|
| 2006/0066609 | A1* | 3/2006 | Iodice | G06T 19/20 345/419 |
| 2014/0207420 | A1* | 7/2014 | Edwards | G06T 17/00 703/1 |

FOREIGN PATENT DOCUMENTS

| EP | 2 216 754 | | 8/2010 | |
|---|---|---|---|---|
| EP | 2216754 | A1 * | 8/2010 | G06F 17/50 |

OTHER PUBLICATIONS

Extended European Search Report dated Jan. 29, 2016 in European Patent Application No. 15306175.9.
(Continued)

*Primary Examiner* — Cedric Johnson
(74) *Attorney, Agent, or Firm* — Oblon, McClelland, Maier & Neustadt, L.L.P.

(57) ABSTRACT

A computer-implemented method for computing a measurement on a set of geometric elements of a modeled object. The method comprises displaying a modeled object and selecting a first geometric element of the modeled object. The method also comprises displaying at least one icon that represents a computable measurement. The icon is selected according to the first geometric element. The method further comprises selecting a second geometric element of the modeled object, computing a measurement represented by the said at least one icon according to the selected first and second geometric elements. Then a value of the computed measurement is displayed.

19 Claims, 4 Drawing Sheets

(51) Int. Cl.
*G06F 3/0484* (2013.01)
*G06F 3/0488* (2013.01)

(56) References Cited

OTHER PUBLICATIONS

Lê Dung: "capture 1", Nov. 4, 2014, XP054976312; Retrieved from the Internet: http://www.youtube.com/watch?v=jfeN0cz1Cas Jan. 20, 2016, Figures 1-4.

* cited by examiner

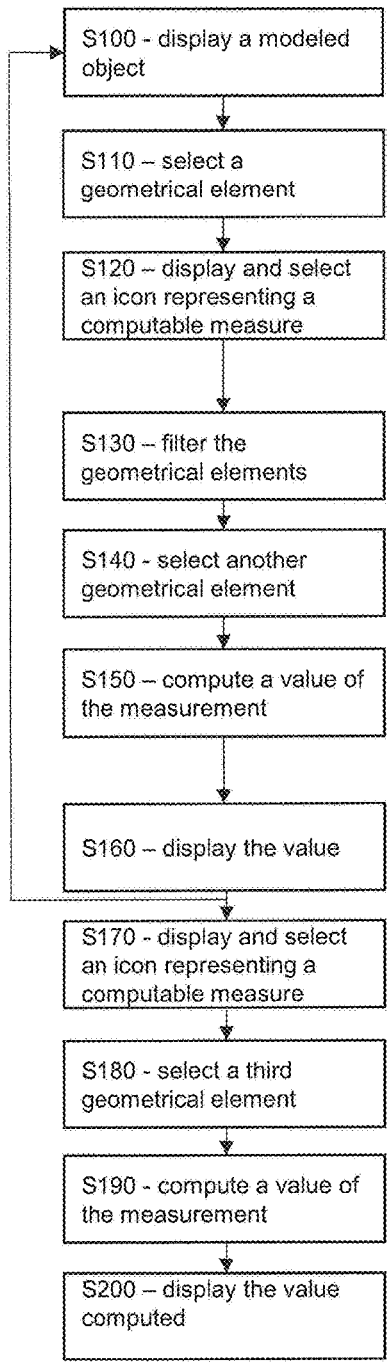
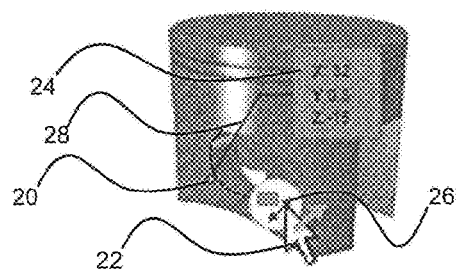
FIG. 2
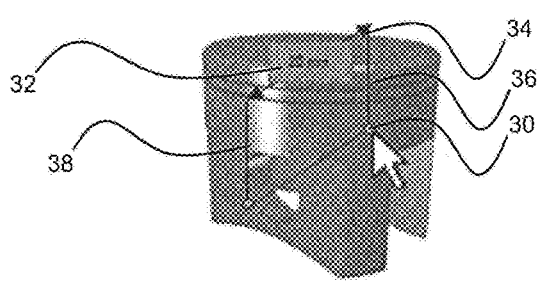
FIG. 3
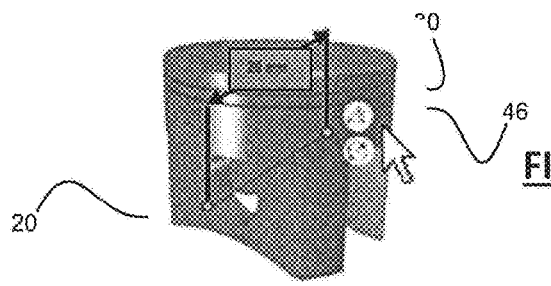
FIG. 4
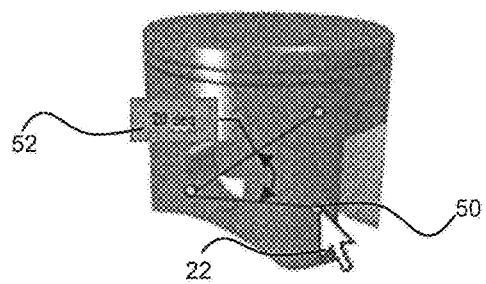
FIG. 5
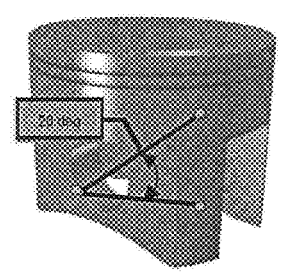
FIG. 6
FIG. 1

| Selected geometrical element | Measurement type |
|---|---|
| Point, free point, center | Distance; and<br>then Angle, Diameter/Radius (using 3 points) |
| Line, curves | Distance; and<br>then Angle (using 3 points) |
| Circle | Distance |
| Plan | Distance, Angle |
| Surface | Distance, Angle |
| Product | Inertia, Volume, Distance (but no multi-selection of product) |
| Cylinder | Distance |
| Axis | Distance, Angle |
| Sphere | Volume, Diameter |
| Cone | Volume, Angle |

FIG. 14

COMPUTATION OF A MEASUREMENT ON A SET OF GEOMETRIC ELEMENTS OF A MODELED OBJECT

CROSS-REFERENCE TO RELATED APPLICATIONS

This application claims priority under 35 U.S.C. 119 to European Patent Application No. EP 15306175.9 filed Jul. 17, 2015, the entire contents of which is incorporated herein by reference.

TECHNICAL FIELD

The invention relates generally to the technical field of computer programs and systems, and more specifically to a method of computation of a measurement between geometric elements of a modeled object.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise.

The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

CAD software can provide an authoring tool that is a software package that developers use to create and package content deliverable to end users. For instance, a designed object can be inserted (or transformed) into a document that is a technical illustration of the product that comprises the design object. The authoring tool thus allows to export and import a modeled object in a document, but it further allows the reviewer to enrich the modeled object by adding annotations. A typical example is the creation with the authoring tool of user guide (or manual) wherein the objects designed with the CAD application are represented in 2D or in 3D.

In CAD systems and authoring program, the user needs to perform measurements on the modeled objects. CAD systems provide different tools to make measurement or display a measurement of a product, e.g. measurements on a three-dimensional modeled product. A general definition of the term measurement is a value to assess a relationship between entities. For instance, a linear length is a measurement between two entities. As another example, an angle is a measurement between three entities.

A known method for performing a measurement is to select 1) a type of measure, 2) the entities involved in the measure, and 3) finally calculate the value of the measurement. For instance, the distance between two points on an object comprises: the user selection of a command of measuring a linear length between two points, a further selection of two points on the modeled object, and the displaying of the value representing the linear length between the two selected points. If the user needs to display a new measurement, he needs to perform all these steps again.

This method suffers several drawbacks. First, there is one command for each type of measurement. As a result, there are clearly too many commands and the user loses a lot of time searching for right command to use. A second problem is that the commands are represented on a menu that need to be displayed. This is particularly a problem on mobile devices (e.g. a tablet computer) as the commands are shown on an action bar that fills a non-negligible part of the graphical user interface (GUI): for instance, the modeled object(s) on the GUI is partially hidden. A third problem is that the user needs to call the action bar each time a command is selected: indeed, the action bar is in general hidden in order to free the GUI, e.g. for a complete view of the modeled object displayed in the GUI. Another issue is the mouse miles and the click number. For measuring a linear length as in the previous example, the user has to move the mouse to a dedicated part of the GUI to unhide the action bar, then he searches the command among the commands, then he moves the mouse over the good command, clicks on it, moves the mouse over a first point of the modeled object, selects this first point, then he moves the mouse on a second point of the modeled object, and selects it. A further problem is that each measurement is stored in a standalone way: it not possible to modify a measurement already stored, and it is not possible to reuse a part of (or the totality) a measure already use. This is problematic because the quantity of information stored on the database increases with the number of measures stored on it.

Within this context, there is still a need for an improved method for computing a measure between geometric elements of a modeled object. Preferably, the method decreases the user inputs for performing the measurement and the amount of space for storing a measure.

SUMMARY OF THE INVENTION

The invention therefore provides a computer-implemented method for computing a measurement on a set of geometric elements of a modeled object. The method comprises displaying a modeled object, selecting a first geometric element of the modeled object, displaying at least one icon that represents a computable measurement, the said at least one icon being selected according to the first geometric element, selecting a second geometric element of the modeled object, computing a measurement represented by the said at least one icon according to the selected first and second geometric elements, displaying a value of the computed measurement.

The method may further comprise:
the display of the value of the computed measurement comprises the display of the value of the computed measurement on a label;

after the selection of the first geometric element: creating an object that stores properties for characterizing the computed measurement;

the properties of the object are selected among: an identifier; a creation date; the value of the measurement; anchors of the measurement; pointers to the modeled object; graphical properties; a position of a label that shows the value at the displaying step;

the modeled object is a two-dimensional modeled object or three-dimensional modeled object;

before the selection of the first geometric element: creating a subset of geometric elements of the modeled object by applying a filter; and wherein the first and second geometric elements are geometric elements of the subset;

the geometric elements of the subset are highlighted;

the computed measurement is one among: a distance; an angle; a volume;

the selection of the first geometric element is performed upon a first user interaction on the first geometric element, the first user interaction being not maintained; one of the displayed at least one icon is selected upon a second user interaction on the said one of the displayed at least one icon, the second user interaction being maintained; the selection of the second geometric element is performed by releasing the second user interaction on the second geometric element;

the selection of the first geometric element is performed upon a first user interaction on the first geometric element, the first user interaction being not maintained; one of the displayed at least one icon is selected upon a second user interaction on the said one of the displayed at least one icon, the second user interaction being not maintained; the selection of the second geometric element is performed upon a third user interaction on the second geometric element, the third user interaction being not maintained;

displaying at least one icon that represents a second computable measurement, the said at least one icon being selected according to the first and second geometric elements; selecting a third geometric element of the modeled object; computing a measurement represented by the said at least one icon according to the selected first, second and third geometric elements; displaying a value of the computed measurement;

geometric element of the model object is one among: a point, a line, a curve, a circle, a surface, a plane, a cylinder, a cone, a sphere, an axis, a set of geometric elements forming a product;

after the selection of the at least one icon, the steps of: undoing the selection of the selected at least icon; and selecting another icon.

It is further provided with a computer program for computing a measurement on a set of geometric elements of a modeled object, comprising instructions performing the steps of the above method of any of claims 1 to 13.

It is also provided with a computer system for computing a measurement on a set of geometric elements of a modeled object comprising a processor communicatively coupled to a memory, and a display, the memory storing the above computer program.

DESCRIPTION OF THE FIGURES

A system embodying the invention will now be described, by way of non-limiting example, and in reference to the accompanying drawings, where:

FIG. 1 is a flowchart showing an example of the invention;

FIGS. 2, 3, 4, 5, and 6 are screenshots depicting a first example of the invention;

FIG. 14 is a table showing a relationship between geometric elements and measurement types available;

DETAILED DESCRIPTION

Figure 7:
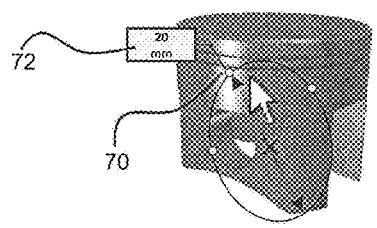
FIGS. 7 and 8 are screenshots depicting a second example of the invention.

The invention is directed to a computer-implemented method for computing a measurement on a set of geometric elements of a modeled object. The method comprises the display of a modeled object, e.g. a three-dimensional modeled object that comprises geometric elements. The method also comprises the selection of a first geometric element of the modeled object, e.g. upon user action. The method further comprises the display of at least one icon that represents a computable measurement. The displayed at least one icon is selected among several icons, wherein each icon represents a computable measure. The selection of one icon among several icons is carried out according to the first geometric element. Said otherwise, one or more icons are identified among a set of icons as a consequence of the selected first geometric element. Moreover, the method comprises the selection of a second geometric element of the modeled object, e.g. upon user action. Then, a measurement that is represented by the said at least one icon is computed. This computation is performed according to the selected first and second geometric elements. The method also comprises the display of a value of the computed measurement.

The method improves the way the user performs a measurement. Each time a measurement process is started, one or more assistant tools—an icon—are shown to the user; the user does not need any more to select on a taskbar the command associated with the measurement. In addition, the user is provided with a visual indication (that is, the assistant tool or icon) that the system is in condition to perform a type of measurement. Thus the user knows that a next interaction with one of the geometric elements of the modeled object will trigger the computing of a measurement. This advantageously facilitates undo operation if the user is not satisfied by the selected type of measurement or the selected geometric element. Consequently, the user has a better control of the measurement process. Moreover, the method allows morphing a measurement to generate new measurements; here the term morphing means the ability to transform an existing measurement into a new measurement. The first type of measurement can be reused in order to produce a second type of measurement, potentially completely different; for instance, one could obtaining a circular measure from a linear measure. This advantageously reduces the number of objects stored in memory as information already stored can be reused for obtaining a new measurement. Furthermore, the assistant(s) tools the icons—are displayed according to the selected first geometric element. The user's choice of a measurement is thus guided by the selected geometric element of the modeled object, and the user can select immediately and more easily the possible measures because less commands are shown before his eyes. Less commands means a restricted choice for any user, and therefore less visual attention is required for performing a selection. Each user that performs a measurement experiences less eye strain as his eyes do not need any more to browse the display all of the time. The assistant tools—the icons—displayed according to the first selected geometric element can indeed be placed in the area of the modeled object, e.g. a predetermined distance of the cursor of the mouse used for selecting the first geometric object. In addition, mouse mile and the click number are also reduced as all the operations in connection with the measurement process can be carried out is a delimited area of the GUI.

The method is computer-implemented. This means that the steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement the user's wishes. In examples, this level may be user-defined and/or pre-defined. For instance, the selection of geometric elements can be performed by the user, while the computation of the value of the measurement is performed by the computer. The selection of an icon representing a computable measurement can be performed upon a user interaction, e.g. the user interacts with the GUI through a mouse or on a touch sensitive screen with an appendage (stylet, finger . . . ).

A typical example of computer-implementation of the method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physically distinct parts (e.g. one for the program, and possibly one for the database).

By "database", it is meant any collection of data (i.e. information) organized for search and retrieval. When stored on a memory, the database allows a rapid search and retrieval by a computer. Databases are indeed structured to facilitate storage, retrieval, modification, and deletion of data in conjunction with various data-processing operations. The database may consist of a file or a set of files that can be broken down into records, each of which consists of one or more fields. Fields are the basic units of data storage. Users may retrieve data primarily through queries. Using keywords and sorting commands, users can rapidly search, rearrange, group, and select the field in many records to retrieve or create reports on particular aggregates of data according to the rules of the database management system being used. In the present invention, the modeled object can be stored on a database.

Figure 15:
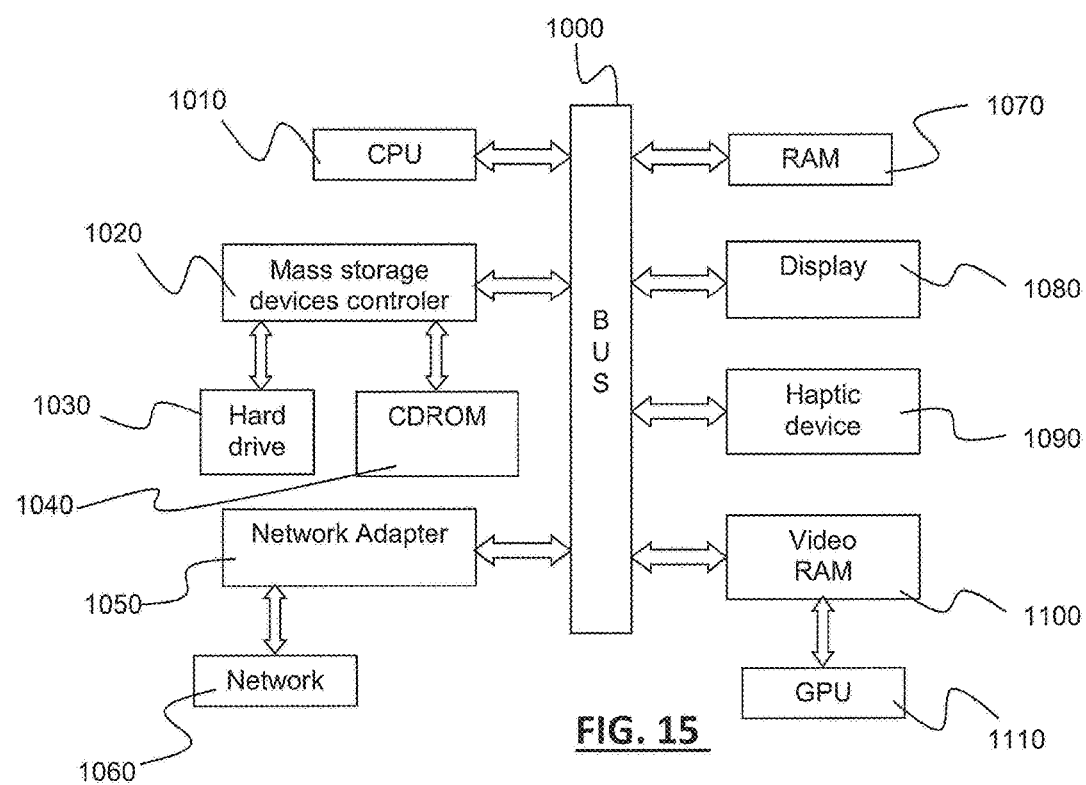
FIG. 15 shows an example of a system for performing the invention.

FIG. 15 shows an example of a system for performing the method of the invention. The system is typically a computer, e.g. a tablet. The computer of FIG. 15 comprises a central processing unit (CPU) 1010 connected to an internal communication BUS 1000, a random access memory (RAM) 1070 also connected to the BUS. The computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The computer may also include a haptic device 1090 such as pointer control device (also referred to as cursor control device) or the like. A pointer control device is used in the computer to permit the user to selectively position a pointer (also referred to as cursor) at any desired location on the display 1080. The display 1080 may be a monitor or the like as known in the art. The display 1080 may be touch-sensitive display 1080. The touch-sensitive display (also referred to as touch screen) is a hardware display unit attached to a computer which responds to touch made on its front surface. It can support one, two or multiple simultaneous touches. In addition, the pointer control device allows the user to select various commands, and input control signals. The pointer control device includes a number of signal generation devices for input control signals to system. In the context of a touch-sensitive display, the haptic device 1090 (a touch-screen sensor and its accompanying controller-based firmware) are integrated on the display and the pointer control device on a touch-sensitive display is an appendage that may be, but is not limited to, a finger, a stylus. In the context of a display that is not a touch-sensitive display, the haptic device 1090 can be, but is not limited to, a mouse, a trackball.

The present invention can be implemented by a computer program. The computer program comprises instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

Referring now to FIG. 1, at step S100, a modeled object is displayed, e.g. on a computer display or touch-sensitive display. The display of the object is performed as known in the art.

The modeled object can be a two-dimensional (2D) or a three-dimensional (3D) modeled object. By "3D modeled object", it is meant any object which is modeled by data allowing its 3D representation by using a collection of points in 3D space, connected by various geometric entities such as triangles, lines, curved surfaces, etc. A 3D representation allows the viewing of the part from all angles. For example, a 3D modeled object, when 3D represented, may be handled and turned around any of its axes, or around any axis in the device on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process. By "2D modeled object", it is meant any object which is modeled by data allowing its 2D representation. A 2D representation allows the viewing of the part from one single point of view. 2D modeled object is a geometric model of an object as two-dimensional figure, usually on the Euclidean or Cartesian plane. A 2D geometric model is often adequate for certain flat objects, such as paper cut-outs and machine parts made of sheet metal.

The modeled object comprises geometric elements; the geometric elements may be also referred to as graphical elements, graphical components or simply graphics. The expression geometric elements means a displayable element which may be partly or totally selected by the user. A geometric element is a graphic entity used in a data set, and it can be, but is not limited to, a point, a line, a curve, a circle, a surface, a plane, a cylinder, a cone, a sphere, an axis. Furthermore, a geometric element can be defined as a set of geometric elements from the list above.

It is to be understood that the steps of the present method are carried out on a graphical user interface (GUI) that is displayed on the display device. The GUI is a graphical interface that allows the users to interact with a computer system. The interactions are generally performed with the menus and the toolbars containing a set of user-selectable icons, each icon being associated with one or more operations or functions, as known in the art. The GUI may further show various types of tools; for example, the GUI of a computer-aided design (CAD) system may comprise graphic tools for facilitating 3D orientation of the object, for triggering a simulation of an operation of an edited product or rendering various attributes of the displayed product. It is to be understood that the present invention can be carried out on any kind of GUI accepting user interactions.

In FIGS. 2-6, it is shown a 3D representation on a GUI of a 3D modeled object that models a mechanical part, here a piston that moves up and down inside a cylinder (not represented). The modeled piston comprises several selectable geometric elements. The GUI is not represented for the sake of simplicity.

Next, at step S110 of FIG. 1, one of the geometric elements of the modeled object is selected. The selection of the first geometric element can be performed upon user action, or automatically. Preferably, the selection is done by the user performing the measurement. The selection of a geometric element is performed as known in the art. For instance, if the pointer control device is a mouse, the selection can be performed by clicking on the mouse. As another example, if the display device is a touch sensitive display, the selection can be performed by performing a tap with an appendage (e.g. a finger, a stylus) over the representation of the geometric element.

Referring now to FIG. 2, a user has selected a free point 20 located on an edge that is represented with a dotted line on FIG. 2 for clarity purpose only. The selection has been carried out with a cursor 22 located over the free point 20—the location of the cursor 22 as represented in FIG. 2 is not the location where the selection of the free point was carried out. Interestingly, the edge on which the free point 20 is located is also a geometric element of the piston, and the free point is a sub geometric element of the edge. The free point is a point of the mesh that defines boundary of the 3D representation of the piston. The selected geometric element 20 may be highlighted for the purpose of indicating the geometric element is currently selected.

Still in reference to FIG. 2, it is also shown a label 24, 28 that appeared as a result of the selection of the geometric element 20. The label comprises an icon 24 where information about the geometric element 20 is displayed; here the coordinates (x,y,z) of the free point in a 3D scene wherein the piston is located. The icon of the label is typically a 2D icon, that is, the icon can only be represented as a two-dimensional figure, usually on a plane (e.g. Euclidian or Cartesian plane) mixed up with the plane of the display device (for instance the computer screen). The label may further comprise an anchor 28 that is a line or polyline for connecting the icon with the selected geometric element. In FIG. 2, the anchor 28 starts from the free point for a better comprehension of which geometric element the displayed information 24 is related. The anchor can start from a point of the geometric element that is automatically selected by the system, e.g. it may be the center of a geometric element "line", the center of a geometric element "sphere". The anchor connects the icon with the selected geometric element.

Back to FIG. 1, at step S120, at least one icon that represents a computable measurement is displayed. A measurement is a function that associates a numerical value to a given subset of a set of items. In practice, a measurement is a value (a number or quantity) that records a directly observable physical quantity. A measurement is generally attached with a unit of measurement that is a definite magnitude of a physical quantity, defined and adopted by convention or by law that is used as a standard for measurement of the same physical quantity. A measurement can be of the type, but is not limited to, a distance (length, width, height, depth), an angle (plane angle, solid angle, angular position, angle of rotation), a volume, an area, a time, a mass, a temperature, an amount of substance, an electric current. Derived physical quantities may be also measures, such as quantity, quantity spatial density, time derivative, specific quantity, spectral quantity, molar quantity, quantity gradient, flow, flux density, current, moment of quantity. Unit of measurement associated with a type of measurement is defined and adopted by convention: the selection of a given unit of measurement is thus an arbitrary choice that does not impede the method of the invention. In practice, units of measurements are parameters of the system running the invention and they are configurable by the user.

The expression computable measurement means that a value, associated with the type of measurement represented by the icon, will be computed as a result of the selection of the icon and of the selection of a second geometric element of the modeled object.

The one or more icons that are displayed are selected according to the first geometric element. Said otherwise, the type of measurement that can be computed afterward is determined by the first geometric element selected at step S110. Each type of measurement that can be processed after the selection of the first geometric element is presented to the user as an icon so that the user knows what kind of measurement the system can performs. In addition, the user can more easily select a measurement type as only the next possible measurement types are shown. FIG. 14 is a table that shows examples of measurement types that can be calculated according to the selected first geometric element. On FIG. 2, an icon 26 representing a measurement of the type "length" is displayed as the selected first geometric element was a free point 20. The graphical representation of the icon representing the measurement of type "length" has the shape of a circle in FIG. 2, being understood that any shape can be used, e.g. a rectangle similar as the one for the icon 24 of the label 24, 28. The icon(s) representing a computable measure is(are) preferably displayed close to the first geometric element. By this way, the selection of one of the displayed icons will be performed in a more rapid, coordinated and effective fashion as the cursor or the appendage is in proximity of the first geometric element. The distance between the icon and the geometric element may be predetermined, e.g. a number of pixels, an Euclidian distance. The icon(s) can be positioned distributed for instance along a circle edge, or an ellipse, that are centered on the selected the first geometric element. In addition, the icon(s) may be located at the opposite position of the label 24, 28 in order to improve the distribution of the different icons (of the measurement type and of the label).

The selection of the measurement type is performed upon user interaction on the icon representing the computable measurement. This can be performed as known in the art. For instance, if the pointer control device is a mouse, the selection can be performed by clicking on the mouse when the pointer 22 is over the icon 26. As another example, if the display device is a touch sensitive display, the selection can be performed by placing an appendage (e.g. a finger) over the icon 26 and tapping the icon with the appendage, or only by placing the appendage on the icon 26.

As a result of the selection of the measurement type, the system knows what measurement to perform.

Back to FIG. 1, at step S130, a subset of geometric elements of the modeled object may be created. This is typically performed by applying a filter. A filter can be associated with one or more geometric elements. For instance, a filter can select all the geometric elements that are a point or a center. As another example, a filter can select all the geometric element of the modeled object that are a line or a curve. In practice, a filter is associated with one geometric element, except for the geometric elements point free points and center that form one subset and the geometric elements lines and curves that form another subset. The selection of a subset of geometric elements can be triggered upon user action, for instance by clicking on an icon that is associated with a filter. The creation of a subset may also be created automatically, e.g. the subset comprises geometric element of the same type as the selected first geometric element. It is to be understood that two or more subsets may be selected. The selection of two or more subset can rely exclusively on user's selections, or on a combination of user's selection and automatic selection.

Interestingly, the creation of one or more subsets of geometric elements can be performed earlier in the method of the invention. Interestingly, a creation of at least one subset may be done before the step S110 of FIG. 1; thus, the selected first geometric element of the modeled object belongs to a selected subset of geometric elements. By this way, the user can benefit of the advantages of the creation of the subset of geometric elements at an earlier stage. Indeed, subsets of geometric elements of the modeled are useful for the user because they makes easier the selection of a geometric element; for instance, the representations of the geometric elements of the subset may be emphasized, e.g. by highlighting the geometric elements of the set. In addition, this advantageously allows the system to better interpret a user interaction, especially in the case the user cannot or is not able to perform precisely a user interaction on a given geometric element. This is notably the case when the user interacts on the touch-sensitive display with his finger, or even with a stylus. Therefore, even is the user does not precisely place his finger over the geometric element, the system will interpret this user interaction as being performed on the geometric element. The geometric element is selected.

Next, at step S140, a second geometric element of the modeled object is selected. This selection is performed as known in the art; for instance, this is performed the same way as for the first geometric element. It is to be understood that the second geometric element can be only selected among the geometric elements of the subset created at step S130 (if such subset was created).

FIG. 3 shows the selection of a second geometric element 30 that is a free point of the modeled object.

Then, at step S150, the system computes a value of the computable measurement represented by the said at least one icon. The computation relies on the selected first and second geometric elements. The computation of the measurement is performed as known in the art. A value of the measurement is provided as a result of the computation.

Next, the value of the computed measurement is displayed, at step S160. The display is created as known in the art.

Preferably, the display of the value of the computed measurement comprises displaying the value of the computed measurement on a label, e.g. the label is a 2D icon with an anchor as discussed in reference to FIG. 2. The position of the label may depends on the type of measure. The label is placed in a relevant way so that it can clearly be seen and do not interfere with the selected geometries. In other words, the label where the value of the computed measurement is shown is placed according to the current point of view of the user and the position of selected geometries. FIG. 3 shows an example of the display of the value of the computed measurement on a label 32 (here the measure is of the type distance between two free points). The label is located over a double arrow 34 that is placed between two anchors 36, 38 for making easier the identification of the two selected geometric elements. Interestingly, the label 32 is kept parallel with the plane of the display device (for instance the computer screen) so that the value of the measurement is always visible for the user, even if the 3D modeled object is rotated.

At this step of the method, a first measurement have been computed and displayed to the user. The user can make a new measure by repeating the steps S100-S160.

The user can alternatively create a new measurement from an existing measurement, e.g. the measurement previously obtained. This is possible because the measurements are stored as objects, e.g. in a database or a PLM database. Here the term object means a file comprising properties for characterizing the measure to be computed or already computed. The object (also referred to as measurement object) can be created after the selection of the first geometric element. When created, the object may not be immediately stored in persistent memory (e.g. on a database), but it is stored at least in non-persistent memory of the system (e.g. on random access memory). The object may comprise several properties that are completed as the same time related data are created. The ability of complete the measurement object makes easier undo operations while creating a measure. For instance, the user can undo the selection of measurement type, and as a result, the former icons are displayed again and they can select another measurement type. Similarly, the user can undo the selection of the second geometric element and select another one. In practice, the object comprises at least a unique identifier property, e.g. the object is created as a result of the selection of an icon associated with a computable measurement. The object may further comprise a creation date, the value of the measurement computed at step S150, one or more anchors of the label, the position of the label that displays the value of the measurement, graphical properties of the label (e.g. shape of the icon), the creator of the measure (which user), the type of measure, pointers for the context of creation of the measure (for instance the measure is performed for a project review) and pointers to the geometric elements of the modeled object concerned by the measurement.

As discussed previously, the user has the possibility to create a new measurement from a measurement previously computed. This implies that the measurement object will be modified taking into account of the new or modified properties characterizing the new measurement. Advantageously, the number of measurement objects that are stored decreases as an existing measurement object can be recycled. The possibility of creating a further measurement from an existing one may be open only for given combinations of geometric elements. For instance, when the first and second geometric elements (steps S100 and S140) are selected among a subset (i) of geometric elements that comprises points, free points, and centers; when the first and second geometric elements are selected among a subset (ii) of geometric elements that comprises lines, curves. For the subset (i), the next measurement types can be an angle or a diameter radius. For the subset (ii), the next measurement type can be an angle, but also a distance between the two lines selected. FIG. 14 shows examples of further measurements.

At step S170, at least one icon that represents a computable measurement is displayed. This is performed the same way as step S120, except that the one or more icons are selected according to the first and second geometric elements. Said otherwise, the icons(s) associated with a computable measurement are selected according to the former measurement performed. The newly displayed one or more icons are preferably located close to the second geometric element. By this way, the selection of one of the displayed icons will be performed in a more rapid, coordinated and effective fashion as the cursor or the appendage is in proximity of the second geometric element. Again, the distance between the icon(s) and the second geometric element is predetermined, e.g. a number of pixels, an Euclidian distance.

The selection of an icon representing the computable measurement is performed upon user interaction. This is performed the same way as discussed for step S120.

Referring to FIG. 4, the first 20 and second 30 geometric elements are free points and belong to a same subset of geometric elements that comprises points, free points, and centers. The measurement obtained at step S150 can thus be used for creating a new measurement of the type "angle" or a "diameter radius", as shown on table of FIG. 14. Two icons 46 are thus displayed, one representing the measurement type "angle" and the second one the measurement type "diameter radius". In this example, the user selects the icon representing the measurement type "angle".

Back to the flowchart of FIG. 1, at step S180, a third geometric element of the modeled object is selected. The selection of this third graph geometric element is performed as known in the art. It is to be understood that the selection of the third geometric element is performed on one of the geometric elements of the subset created at step S130 (if such subset was created). Alternatively, the filter selected at step S130 may be disabled or changed by the user so that the user can select any geometric element of the modeled object.

Then, at step S190, the system computes a value of the measurement represented by the selected icon. The computation relies on the selected first, second and third geometric elements. The computation of the measurement is performed as known in the art. A value of the measurement is provided as a result of the computation.

Next, the value of the computed measurement is displayed, at step S200. The display is performed as discussed in reference to step S160.

In FIG. 5, the user has selected a third geometric element 50 of the piston with help of the pointer 22. A measurement of the type "angle" is computed according to the selected first, second and third geometric elements. In this example, the measurement of the type "angle" uses the selected first geometric element as the vertex of the angle; being understood that anyone of the selected geometric element could be the vertex of the angle. The computed measurement is shown on a label 52 (here the measure is of the type angle for three free points). The display of the label 52 is performed the same way as discussed in step S160.

FIG. 6 shows the final result of a measurement as it may be displayed to the user. Here, the angle is highlighted for indicating to the user that the measure has been performed. In practice, this means that the user is aware that a measurement object has been created and is completed, e.g a persistent storage of the measurement object has been performed for instance in a PLM database.

Figure 8:
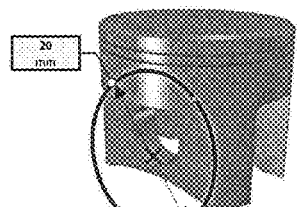
Figures 9, 10:
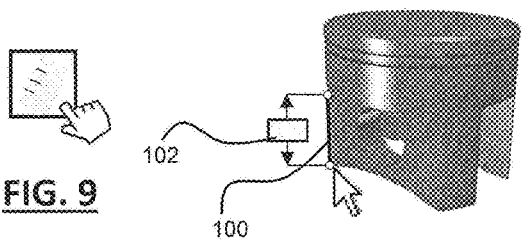
FIGS. 9, 10, 11, 12, and 13 are screenshots depicting a third example of the invention.
Figure 11:
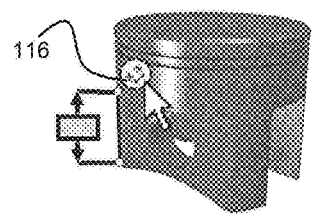
Figure 12:
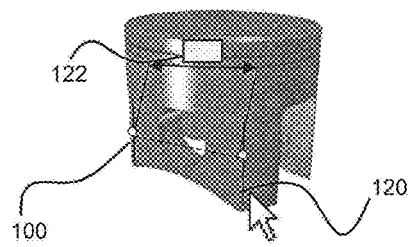
Figure 13:
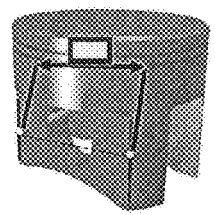

FIGS. 7 and 8 illustrate the case where the user has selected on FIG. 4 the icon representing the measurement type "diameter radius". A third geometric element 70 has been next selected by the user, and the diameter radius has then been computed and the value of the measurement displayed in the label 72. In the case three geometric elements are involved in the computation of a measurement, the label may be anchored to the last selected geometric element. FIG. 8 shows the display of measurement; a measurement object has been created, completed and stored. FIGS. 9 to 13 depict another example of the method according to the invention. On FIG. 9, the user may select a measurement command displayed on the GUI so that the system is aware that the user is attempting to create a measurement. In practice, the modeled object is already displayed (S100) and a measurement object is created that comprises at least a unique identifier property. Then, a subset of geometric elements is obtained by applying a filter on the geometric elements of the modeled object. Here, the user has selected a filter "line" (S130) so that only geometric elements that are a line are selectable by the user. It is to be understood that the user could select two or more filters. On FIG. 10, the users selects a line 100 (S110). A label 102 is displayed as a result of the selection of the line and shows information related to the selected line, here the length of the line. On FIG. 11, the user selects an icon 116 that represents a computable measurement (S120). As the selected geometric element is a line, the measurement type associated with the icon 116 is "distance", as shown in the table of FIG. 14. Then, on FIG. 12, the user selects a second geometric element (S140) that can be only a line as the filter "line" has been previously selected, here the line 120. The distance between the two lines 100, 120 is computed (S150), and the value of the measurement is displayed (S160) in the label 122. FIG. 13 shows a view of the displayed measurement once the measurement process has been performed: the measurement is highlighted and the measurement object can be stored in a persistent way. The labels 102 and 122 can be the same one, that is, the label 102 is automatically displaced and the information it shows is modified when the value of the measurement has been computed. Alternatively, the label 102 and 122 are not the same, and the label 102 is removed from the display as a result of the selection of the second geometric element; the label 122 is then displayed once the value of the measurement has been computed.

It is now discussed the way the user interacts with the modeled object and the icons for performing a measurement according to the invention. The computer, e.g. personal computer, laptop, music player, cell phone, personal digital assistants, can detect any input or movement or breaking of the input applied on it. Three interaction modes are available.

The first one is referred to as single click or tap mode: the user's selections consist in sending signals that are not maintained by the user (a so-called DOWN event). The user interactions are inputs, and each input generates a signal which is transmitted to the computer by the touch-sensitive display or the haptic device (e.g. a mouse or the like). Hence, if the pointer control device of the computer is a haptic device, the user performs an action (e.g. a click) on the haptic device for each selection, and if the pointer control device is integrated on the display of the computer (e.g. in the case of a touch-sensitive display), the user performs a tap on the computer display for each selection. Thus, the selection of the first and second geometric elements is performed by operating a click on the mouse or a taping on the display device. It is to be understood that the user interaction (the click or the tap) is not maintained. Similarly, the selection of an icon representing a computable measurement is a click or a tap, as well as the selection of a third geometric element (if any).

The second mode is referred to as drag and drop or touch and drag mode: user's selections comprises at least one drag and drop or touch and drag user's action. In this mode, the user generally performs the selection of the first geometric element by performing a click or a tap on it; this is similar to the first mode. Then, the selection of an icon representing a computable measurement is performed with a click or a tap on it. The click or the tap is maintained (a so-called HOLD event). Then the user drags the icon toward the second geometric element to be selected, the click or the touch being maintained. Alternatively, the user moves the cursor or the appendage (that is, the user input) toward the second geometric element to be selected, the click or the touch being maintained. When the user's input is over the second geometric element, they releases the click or the touch: the click or the touch is no more maintained. Consequently, the second geometric element is selected, and a value of the measurement is computed and displayed. Interestingly, the second mode allows a real-time display of the value of the measurement according to the position of the pointer on the display, that is, during the drag of the selected icon. Therefore, a measure represented by the said at least one icon is computed according to the selected first geometric element and the position of a pointer on the display device, and an instantaneous (or real-time) value of the computed measurement is displayed. It is to be understood that a label showing the value of the measurement is displayed. For instance, the value may be displayed in the label 102 of FIG. 10. The instantaneous value is displayed while the user maintains the user's interaction (or user's input) on the selected at least one icon. When the user releases the user's interaction on the selected at least one icon, a second geometric element of the modeled object is selected, and a final value of the measurement is displayed. In the second mode, the selection of a third geometric element (if any) is performed the same way as for the first geometric element.

The third mode is a one single click (e.g. on the mouse controlling the cursor) or one single tap (e.g. of an appendage on a touch sensitive screen) mode: the user performs the selection of the first geometric element by performing a click or a tap on it; the click or the tap is maintained (a so-called HOLD event). Then, the selection of an icon representing a computable measurement is performed by moving the cursor or the appendage over the icon, the click or the tap being kept maintained. Then the user moves the cursor or the appendage (that is, the user input) toward the second geometric element to be selected, the click or the touch being maintained. When the user's input is over the second geometric element, they releases the click or the touch: the click or the touch is no more maintained. Consequently, the second geometric element is selected, and a value of the measurement is computed and displayed. The selection of a third geometric element (if any) is performed by clicking or a tapping on it.

While this invention has been particularly shown and described with references to example embodiments thereof, it will be understood by those skilled in the art that various changes in form and details may be made therein without departing from the scope of the invention encompassed by the appended claims.

The invention claimed is:

1. A computer-implemented method for computing, by processing circuitry, a measurement on a set of geometric elements of a modeled object by a processor communicatively coupled to a display including a graphical user interface (GUI), the method comprising:
   displaying, in the GUI, a modeled object;
   before a selection of a first geometric element, creating a subset of geometric elements of the modeled object by applying a filter;
   selecting, upon user action with the GUI, the first geometric element of the modeled object, the first geometric element being a geometric element of the subset;
   determining, by the processor, at least one computable measurement that is processable according to the selected first geometric element;
   displaying, automatically in the GUI, at least one icon, each icon of the at least one icon respectively representing one of the at least one computable measurement;
   selecting, upon user action with the GUI, one of the said at least one icon;
   selecting, upon user action with the GUI, a second geometric element of the modeled object, the second geometric element being a geometric element of the subset;
   computing, by the processor, a measurement represented by the selected at least one icon according to the selected first and second geometric elements; and
   displaying, in the GUI, a value of the computed measurement.

2. The computer-implemented method of claim 1, wherein the display of the value of the computed measurement comprises the display of the value of the computed measurement on a label.

3. The computer-implemented method of claim 1, further comprising, after the selection of the first geometric element:
   creating an object that stores properties that characterize the computed measurement.

4. The computer-implemented method of claim 3, wherein the properties of the object are selected from among:
an identifier;
a creation date;
the value of the computed measurement;
anchors of the computed measurement;
pointers to the modeled object;
graphical properties; and
a position of a label that shows the displayed value.

5. The computer-implemented method of claim 1, wherein the modeled object is a two-dimensional modeled object or three-dimensional modeled object.

6. The computer-implemented method of claim 1, wherein the geometric elements of the subset are highlighted.

7. The computer-implemented method of claim 1, wherein the computed measurement is one from among:
a distance;
an angle; and
a volume.

8. The computer-implemented method of claim 1, wherein:
the selection of the first geometric element is performed upon a first user interaction on the first geometric element, the first user interaction being not maintained,
one of the displayed at least one icon is selected upon a second user interaction on the one of the displayed at least one icon, the second user interaction being maintained, and
the selection of the second geometric element is performed by releasing the second user interaction on the second geometric element.

9. The computer-implemented method of claim 1, wherein:
the selection of the first geometric element is performed upon a first user interaction on the first geometric element, the first user interaction being not maintained,
one of the displayed at least one icon is selected upon a second user interaction on the one of the displayed at least one icon, the second user interaction being not maintained, and
the selection of the second geometric element is performed upon a third user interaction on the second geometric element, the third user interaction being not maintained.

10. The computer-implemented method of claim 1, further comprising:
displaying at least one icon that represents a second computable measurement, the at least one icon being selected according to the first and second geometric elements;
selecting a third geometric element of the modeled object;
computing a measurement represented by the aid at least one icon according to the selected first, second and third geometric elements; and
displaying a value of the computed measurement.

11. The computer-implemented method of claim 10, wherein a geometric element of the modelled object is one from among: a point, a line, a curve, a circle, a surface, a plane, a cylinder, a cone, a sphere, an axis, a set of geometric elements forming a product.

12. The computer-implemented method of claim 1, further comprising, after the selection of the at least one icon:
undoing the selection of the selected at least one icon; and
selecting another icon.

13. A non-transitory computer readable medium having stored thereon a program that when executed by a computer causes the computer to implement a method for computing, by processing circuitry, a measurement on a set of geometric elements of a modeled object, the processing circuitry being coupled to a display including a graphical user interface (GUI), the method comprising:
displaying, in the GUI, a modeled object;
before a selection of a first geometric element, creating a subset of geometric elements of the modeled object by applying a filter;
selecting, upon user action with the GUI, the first geometric element of the modeled object, the first geometric element being a geometric element of the subset;
determining, by the processing circuitry, at least one computable measurement that is processable according to the selected first geometric element;
displaying, automatically in the GUI, at least one icon, each icon of the at least one icon respectively representing one of the at least one computable measurement,
selecting, upon user action with the GUI, one of the at least one icon;
selecting, upon user action with the GUI, a second geometric element of the modeled object, the second geometric element being a geometric element of the subset;
computing, by the processing circuitry, a measurement represented by the selected at least one icon according to the selected first and second geometric elements; and
displaying, in the GUI, a value of the computed measurement.

14. The non-transitory computer readable medium of claim 13, wherein the display of the value of the computed measurement comprises the display of the value of the computed measurement on a label.

15. The non-transitory computer readable medium of claim 13, wherein the method further comprises, after the selection of the first geometric element:
creating an object that stores properties that characterize the computed measurement.

16. The non-transitory computer readable medium of claim 15, wherein the properties of the object are selected from among:
an identifier;
a creation date;
the value of the computed measurement;
anchors of the computed measurement;
pointers to the modeled object;
graphical properties; and
a position of a label that shows the displayed value.

17. A computer system for computing a measurement on a set of geometric elements of a modeled object, comprising
processing circuitry communicatively coupled to a memory; and
a display including a graphical user interface (GUI),
wherein the memory stores a program that when executed by the processing circuitry causes the processing circuitry to be configured to:
control display of a modeled object,
before a selection of a first geometric element, create a subset of geometric elements of the modeled object by applying a filter;
select, upon user action with the GUI, the first geometric element of the modeled object, the first geometric element being a geometric element of the subset, determine at least one computable measurement that is processable according to the selected first geometric element;

control display, automatically in the GUI, of at least one icon, each icon of the at least one icon respectively representing one of the at least one computable measurement, select, upon user action with the GUI, one of the at least one icon, select, upon user action with the GUI, a second geometric element of the modeled object, the second geometric element being a geometric element of the subset, compute a measurement represented by the selected at least one icon according to the selected first and second geometric elements, and control display, in the GUI, of a value of the computed measurement.

18. The computer system of claim 17, wherein the display of the value of the computed measurement comprises the display of the value of the computed measurement on a label.

19. The computer system of claim 17, wherein the processing circuitry is further configured to, after the selection of the first geometric element:

create an object that stores properties that characterize the computed measurement.

* * * * *